(12) United States Patent
Fukuda

(10) Patent No.: US 9,748,127 B2
(45) Date of Patent: Aug. 29, 2017

(54) STRUCTURE FOR FASTENING TOGETHER RESIN MEMBERS IN SUBSTRATE STORING CONTAINER

(71) Applicant: MIRAIAL CO., LTD., Tokyo (JP)

(72) Inventor: Ryuuji Fukuda, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 62 days.

(21) Appl. No.: 14/649,090

(22) PCT Filed: Dec. 4, 2012

(86) PCT No.: PCT/JP2012/081406
§ 371 (c)(1),
(2) Date: Jun. 2, 2015

(87) PCT Pub. No.: WO2014/087486
PCT Pub. Date: Jun. 12, 2014

(65) Prior Publication Data
US 2015/0318196 A1    Nov. 5, 2015

(51) Int. Cl.
| | |
|---|---|
| *H01L 21/673* | (2006.01) |
| *B65D 85/48* | (2006.01) |
| *F16B 11/00* | (2006.01) |
| *F16B 17/00* | (2006.01) |

(52) U.S. Cl.
CPC ........ *H01L 21/67379* (2013.01); *B65D 85/48* (2013.01); *F16B 11/006* (2013.01); *F16B 17/008* (2013.01); *H01L 21/67326* (2013.01); *H01L 21/67386* (2013.01)

(58) Field of Classification Search
CPC ......... H01L 21/67379; H01L 21/67386; H01L 21/673; H01L 21/67326; B65D 85/48
USPC .......................................... 206/454, 710–712
See application file for complete search history.

(56) References Cited

U.S. PATENT DOCUMENTS

| | | | |
|---|---|---|---|
| 5,579,594 A | 12/1996 | Pasqualini et al. | |
| 8,474,626 B2 * | 7/2013 | Chiu ................. | H01L 21/67379 206/454 |
| 8,770,410 B2 * | 7/2014 | Ogawa ............. | H01L 21/67379 206/454 |

(Continued)

FOREIGN PATENT DOCUMENTS

| | | |
|---|---|---|
| JP | S64-30679 A | 2/1989 |
| JP | H06-300020 A | 10/1994 |

(Continued)

*Primary Examiner* — Andrew Perreault
(74) *Attorney, Agent, or Firm* — Muncy, Geissler, Olds & Lowe, P.C.

(57) ABSTRACT

The upper wall is provided with a recess indented from the outside toward the inside of the container main body, and a protrusion projecting outward on the inside of the recess. The top flange is provided with an insertion part which can be inserted into the recess from the outside of the upper wall. The insertion part is provided with a through-hole capable of penetrating from the side further from the upper wall to the side nearer the upper wall. With the recess in the upper wall opening upward and the insertion part of the top flange inserted into the recess, a molten resin poured into the through-hole of the insertion part from above fills the recess from the bottom surface thereof up to the outer peripheral surface of the protrusion and the inner peripheral surface of the through-hole.

3 Claims, 7 Drawing Sheets

(56) References Cited

U.S. PATENT DOCUMENTS

| | | |
|---|---|---|
| 2005/0115866 A1 | 6/2005 | Burns et al. |
| 2006/0283774 A1 | 12/2006 | Hasegawa et al. |
| 2007/0187287 A1 | 8/2007 | Toda et al. |
| 2011/0005966 A1 | 1/2011 | Chiu et al. |

FOREIGN PATENT DOCUMENTS

| | | |
|---|---|---|
| JP | 2005-256983 A | 9/2005 |
| JP | 2006-324327 A | 11/2006 |
| JP | 2007-511098 A | 4/2007 |
| JP | 2011-18878 A | 1/2011 |
| WO | WO 2012/054625 A2 | 4/2012 |

\* cited by examiner

STRUCTURE FOR FASTENING TOGETHER RESIN MEMBERS IN SUBSTRATE STORING CONTAINER

TECHNICAL FIELD

The present invention relates to a structure for fastening together resin members in a substrate storing container, and more specifically relates to a structure for fastening together resin members in a substrate storing container which stores a plurality of substrates such as semiconductor wafers in a state arranging in parallel.

BACKGROUND ART

As a substrate storing container that stores substrates such as a semiconductor wafers, one has been known conventionally that has a configuration including a container main body made of resin and a lid body made of resin.

For the above such substrate storing containers, there are the two types of substrate storing containers of a substrate storing container for shipping (FOSB) and a substrate storing container for use in-process (FOUP). In either type of substrate storing container, various members made of resin are often installed to the container main body. For example, a top flange for ceiling conveying the substrate storing container is installed to an upper face of the container main body. At both right and left outer wall faces of the container main body, a pair of container handles (manual handles) that is necessary for the conveyance of the substrate storing container is installed. On a bottom face of the container main body, a bottom plate is installed.

Conventionally, in order to install various members to the container main body of a substrate storing container, fastening by way of threaded fastening (Japanese Unexamined Patent Application, Publication No. 2005-256983) or fastening by way of press fitting by, for example, press fitting a protrusion into a groove (Pamphlet of PCT International Publication No. WO2012/054625) is generally used.

Patent Document 1: Japanese Unexamined Patent Application, Publication No. 2005-256983
Patent Document 2: Pamphlet of PCT International Publication No. WO2012/054625

BRIEF SUMMARY OF THE INVENTION

Problems to be Solved by the Invention

However, as illustrated in FIG. 7, for example, in the case of fastening by way of threaded fastening, a screw a is fastened to a container main body c via a member b. For this reason, since repetitive loads acting on threaded fastening portion from various directions, there is a risk of loosening of the screw a occurring. In addition, in a case of being subjected to vibration or impact at the screwed portion, loosening of the screw occurs more easily, a result of which fastening tends to be insufficient.

Furthermore, in the assembly process for installing a member to a container main body, for example, it is required to position the member to the container main body with a predetermined precision, and fasten the screw a with a certain torque. For this reason, in addition to time being consumed in the assembly operation, variations also tend to arise due to assembly error.

Furthermore, in the case of fastening by way of press fitting, since repetitive loads act from various directions on a press-fit portion, there is a risk of dislocation occurring at the press-fit portion. In addition, in a case of being subjected to vibrations or impact at the press-fit portion, the press-fit portion is dislocated more easily, a result of which fastening tends to be insufficient.

Furthermore, it is necessary for a protrusion and a groove, for example, implementing press fitting to be manufactured with a predetermined alignment precision. In a case in which the alignment precision between the protrusion and the groove is insufficient, the dislocation occurring at the press-fit portion will be increasingly greater.

It is an object of the present application to provide a structure for fastening together resin members in a substrate storing container which fastens a first resin member of a substrate storing container and a second resin member of a substrate storing container by way of molten resin.

Means for Solving the Problems

The present invention relates to a structure for fastening together resin members in a substrate storing container that fastens a first resin member and a second resin member, the first resin member being part of a substrate storing container that includes: a container main body having a substrate storing space that can store a plurality of substrates formed inside thereof, and having an opening circumferential portion at which a container main body opening portion that is in communication with the substrate storing space is formed at one end portion thereof; a lid body that is removably attached to the opening circumferential portion and can close the container main body opening portion; a lid body side substrate support portion which is a portion of the lid body and arranged at an inner side of the lid body corresponding to a side opposing the substrate storing space when the container main body opening portion is closed by the lid body, and can support edge portions of the plurality of substrates when the container main body opening portion is closed by the lid body; and a back side substrate support portion that is arranged so as to form a pair with the lid body side substrate support portion inside the substrate storing space, that can support the edge portions of the plurality of substrates, and that supports the plurality of substrates in cooperation with the lid body side substrate support portion when the container main body opening portion is closed by the lid body, and the second resin member being part of the substrate storing container, wherein the first resin member includes a recess that is indented from an outer side to an inner side of the substrate storing container, and a protrusion that protrudes outward at an inner side of the recess; in which the second resin member includes an insertion part that can be inserted to the recess from outwards of the first resin member, and the insertion part includes a through-hole that penetrates from a side far from the first resin member to a side near to the first resin member; and in which, in a state in which the recess of the first resin member opens upwards and the insertion part of the second resin member is inserted into the recess, molten resin that is poured into the through-hole of the insertion part from above is filled from a bottom face of the recess up to an outer peripheral face of the protrusion and an inner peripheral face of the through-hole.

Furthermore, it is preferable that the insertion part of the second resin member includes an overhang portion that overhangs to an inner side of the through-hole from an inner peripheral face of the through-hole, and the molten resin is filled up to the inner peripheral face of the through-hole beyond the overhang portion.

Moreover, it is preferable that the first resin member and the second resin member respectively include positioning portions that cooperate with each other to position an interval between the first resin member and the second resin member, when the insertion part of the second resin member is inserted into the recess of the first resin member.

Effects of the Invention

In accordance with the present invention, it is possible to provide a structure for fastening together resin members in a substrate storing container that makes it possible to maintain a stable fastened state with there being no risk of the occurrence of loosening of a screw in a case of threaded fastening, or dislocation in a case of press fitting even in a case of being subjected to vibration or impact at the fastening portion, by way of fastening a first resin member of a substrate storing container and a second resin member of a substrate storing container by way of molten resin.

PREFERRED MODE FOR CARRYING OUT THE INVENTION

Figure 1:
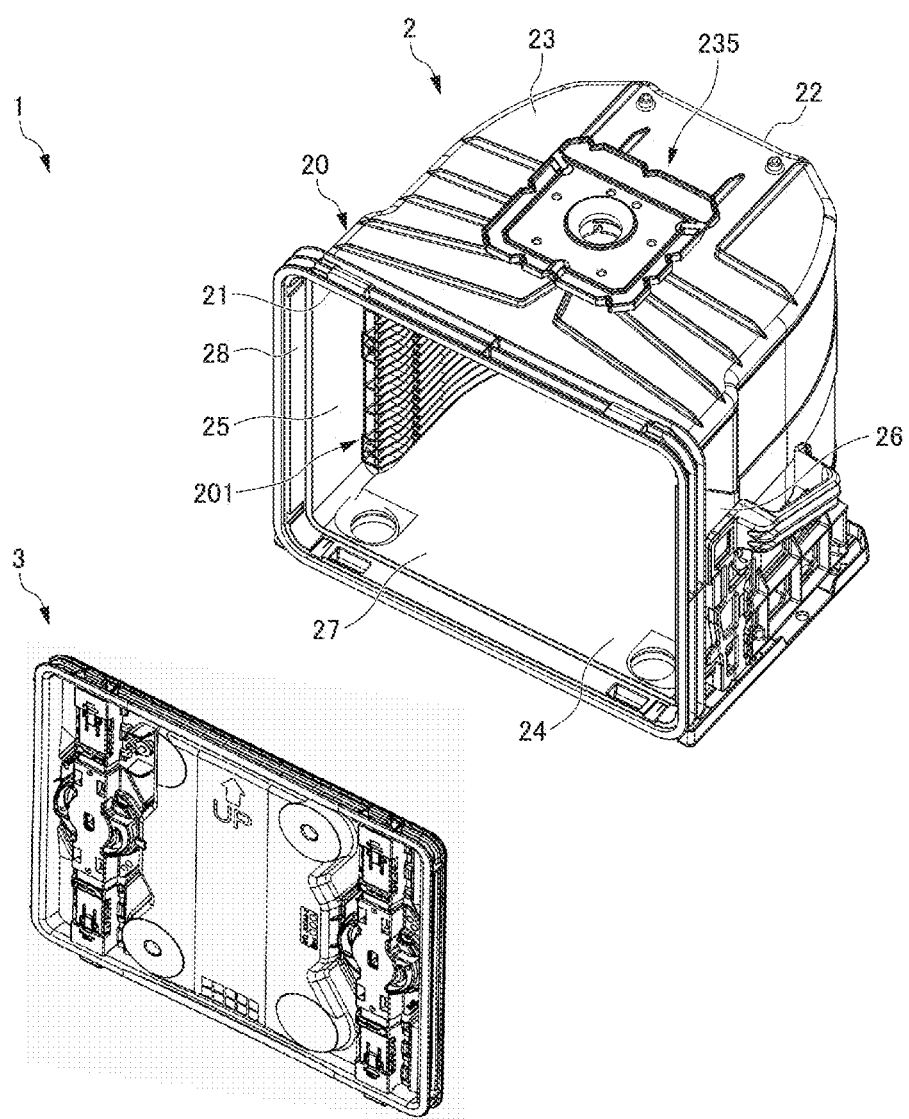
FIG. 1 is a perspective view illustrating a state in which a lid body is removed from a container main body of a substrate storing container to which a structure for fastening together resin members according to an embodiment of the present invention is applied.

A substrate storing container to which a structure for fastening together resin members according to an embodiment of the present invention is applied will be explained hereinafter with reference to FIG. 1. FIG. 1 is a perspective view illustrating a state in which a lid body 3 is removed from a container main body 2 of a substrate storing container 1 to which a structure for fastening together resin members according to an embodiment of the present application is applied.

A substrate (not illustrated) stored in the substrate storing container 1 is a disk-like silicon wafer, glass wafer, sapphire wafer, etc., and is a thin member used in industry. The substrate in the present embodiment is a silicon wafer having a diameter of 300 mm.

As illustrated in FIG. 1, the substrate storing container 1 includes a container main body 2, a lid body 3, a lid body side substrate support portion (not illustrated), and a back side substrate support portion (not illustrated).

As illustrated in FIG. 1, the container main body 2 has a tubular wall portion 20 with a container main body opening portion 21 formed at one end portion and the other end portion closed. A substrate storing space 27 is formed in the container main body 2. The substrate storing space 27 is formed to be surrounded by the wall portion 20. A substrate support plate-like portion 201 is disposed at a part of the wall portion 20 that is a portion forming the substrate storing space 27. A plurality of substrates can be stored in the substrate storing space 27.

The substrate support plate-like portions 201 are provided at the wall portion 20 so as to form a pair in the substrate storing space 27. When the container main body opening portion 21 is not closed by the lid body 3, the substrate support plate-like portions 201 can support the edge portions of the plurality of substrates in a state in which adjacent substrates are arranged in parallel to be spaced apart by a predetermined interval. A back side substrate support portion (not illustrated) is provided at a back side of the substrate support plate-like portion 201. When the container main body opening portion 21 is closed by the lid body 3, the back side substrate support portion (not illustrated) can support rear portions of the edge portions of the plurality of substrates.

The lid body 3 can be removably attached to an opening peripheral portion 28 forming the container main body opening portion 21. The lid body 3 can close the container main body opening portion 21 in a positional relationship surrounded by the opening peripheral portion 28, i.e. in a state in which the lid portion 3 is fit into the container main body opening portion 21 formed by the opening peripheral portion 28. The lid body side substrate support portion (not illustrated) is a part of the lid body 3 and is provided at a side which faces the substrate storing space 27, i.e. inner side of the lid body 3, when the container main body opening portion 21 is closed by the lid body 3. The lid body side substrate support portion (not illustrated) is arranged so as to form a pair with the back side substrate support portion (not illustrated) inside the substrate storing space 27.

When the container main body opening portion 21 is closed by the lid body 3, the lid body side substrate support portion (not illustrated) can support front portions of the edge portions of the plurality of substrates. When the container main body opening portion 21 is closed by the lid body 3, the lid body side substrate support portion (not illustrated) retains the plurality of substrates in a state in which adjacent substrates are arranged in parallel to be spaced apart by a predetermined interval by supporting the plurality of substrates in cooperation with the back side substrate support portion (not illustrated). The configuration illustrated in FIG. 1 will be explained in detail hereinafter.

As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are configured from a plastic material, etc., and are configured so as to be integrally molded with polycarbonate in the present embodiment.

The first side wall 25 faces the second side wall 26, and the upper wall 23 faces the lower wall 24. A rear edge of the upper wall 23, a rear edge of the lower wall 24, a rear edge of the first side wall 25, and a rear edge of the second side wall 26 are all connected to the back wall 22. A front edge of the upper wall 23, a front edge of the lower wall 24, a front edge of the first side wall 25, and a front edge of the second side wall 26 have a positional relationship opposite the back wall 22, and configure the opening peripheral portion 28, which forms the container main body opening 21 in a substantially rectangular shape.

The opening peripheral portion 28 is provided at one edge portion of the container main body 2, and the back wall 22 is located at the other edge portion of the container main body 2. The profile of the container main body 2 formed by the outer faces of the wall portion 20 is a box shape. Inner faces of the wall portion 20, i.e. an inner face of the back wall 22, an inner face of the upper wall 23, an inner face of the lower wall 24, an inner face of the first side wall 25, and an inner face of the second side wall 26, form the substrate storing space 27, which is surrounded by these. The container main body opening portion 21 formed at the opening peripheral portion 28 is in communication with the substrate storing space 27, which is surrounded by the wall portion 20 and formed inside the container main body 2. As described later, the substrate storing space 27 can store a maximum of twenty-five substrates W.

As illustrated in FIG. 1, a flange installation portion 237 (refer to FIGS. 2 to 5) is provided so as to be integrally molded with and part of the upper wall 23 on an outer face of the upper wall 23 and serves as a first resin member. The top flange 235, including installation portion 236 which serves as a second resin member, is installed at the flange installation portion 237. The top flange 235 is a portion that, upon suspending the substrate storing container 1 on a conveying device such as an AMHS (Automated Material Handling System) and PGV (Person Guided Vehicle), is hung to be suspended by being held at a flange engaging portion (not illustrated) provided to these devices.

In the following, various embodiments of a structure for fastening together resin members in a substrate storing container will be explained with reference to FIGS. 2 to 5.

Figure 2:
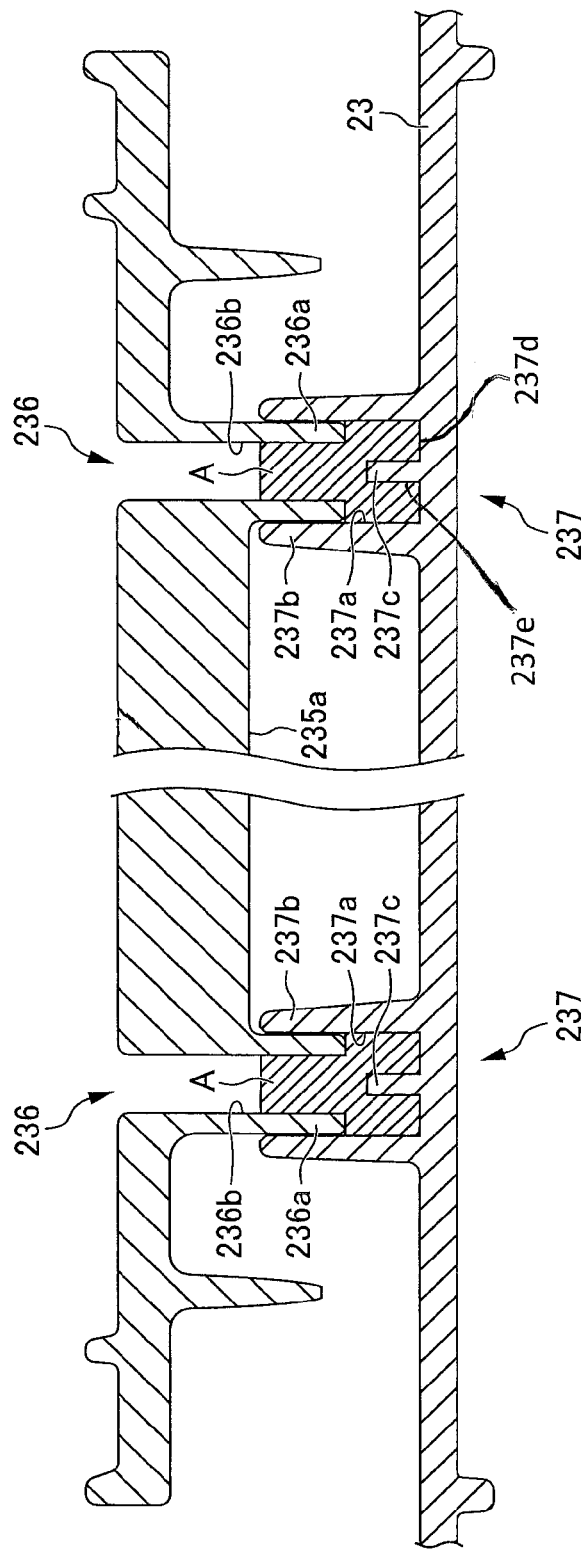
FIG. 2 is a vertical sectional view illustrating a structure for fastening together resin members according to a first embodiment of the present invention.
Figure 3:
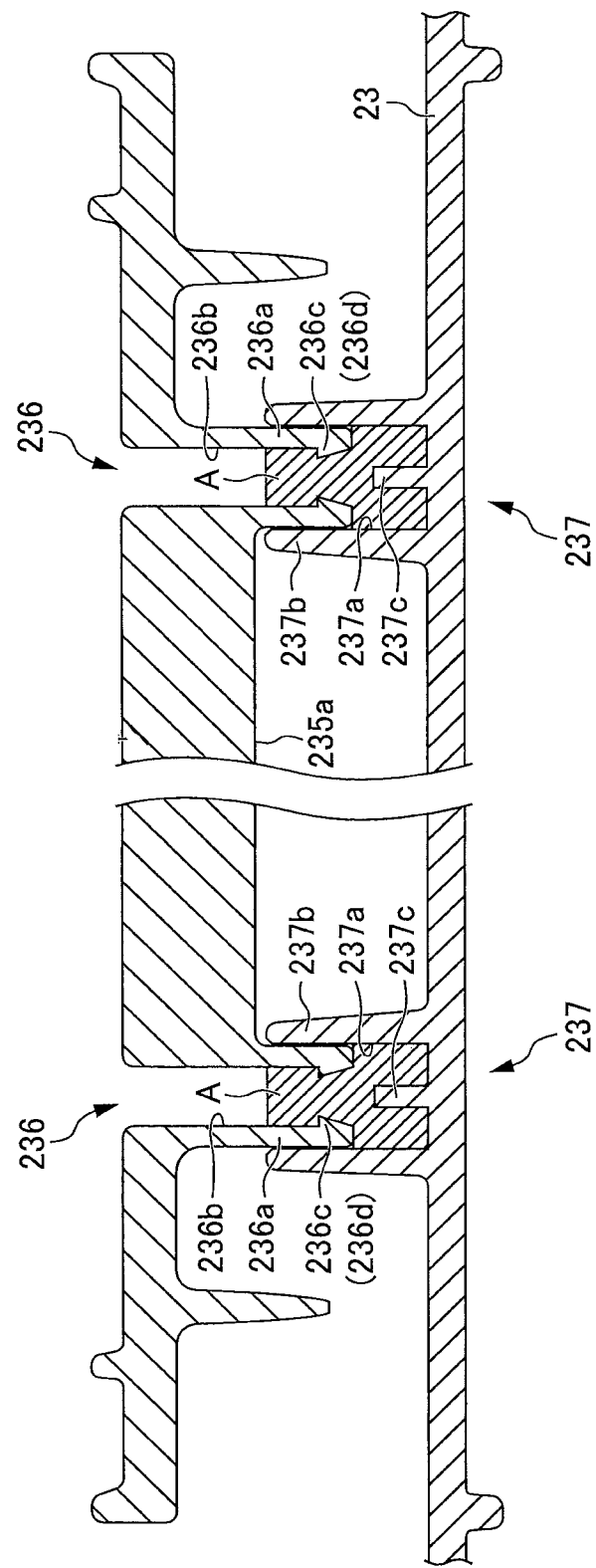
FIG. 3 is a vertical sectional view illustrating a structure for fastening together resin members according to a second embodiment of the present invention.
Figure 4:
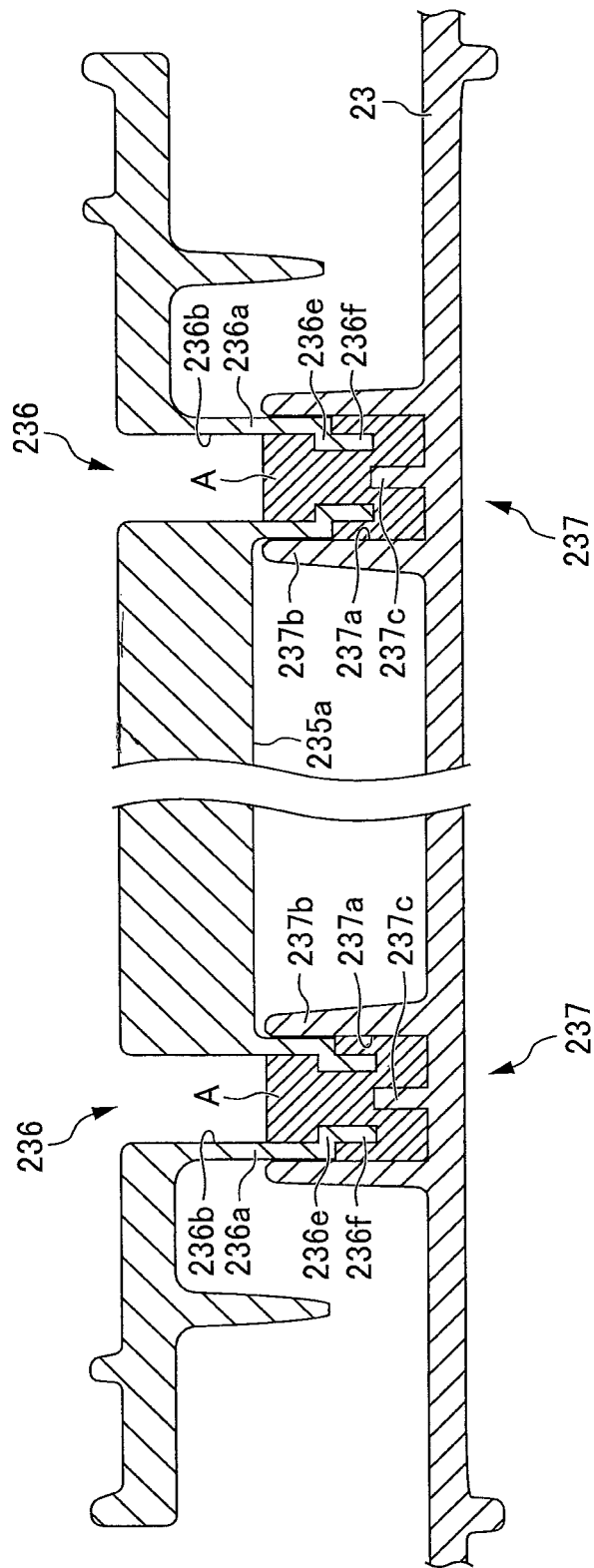
FIG. 4 is a vertical sectional view illustrating a structure for fastening together resin members according to a third embodiment of the present invention.
Figure 5:
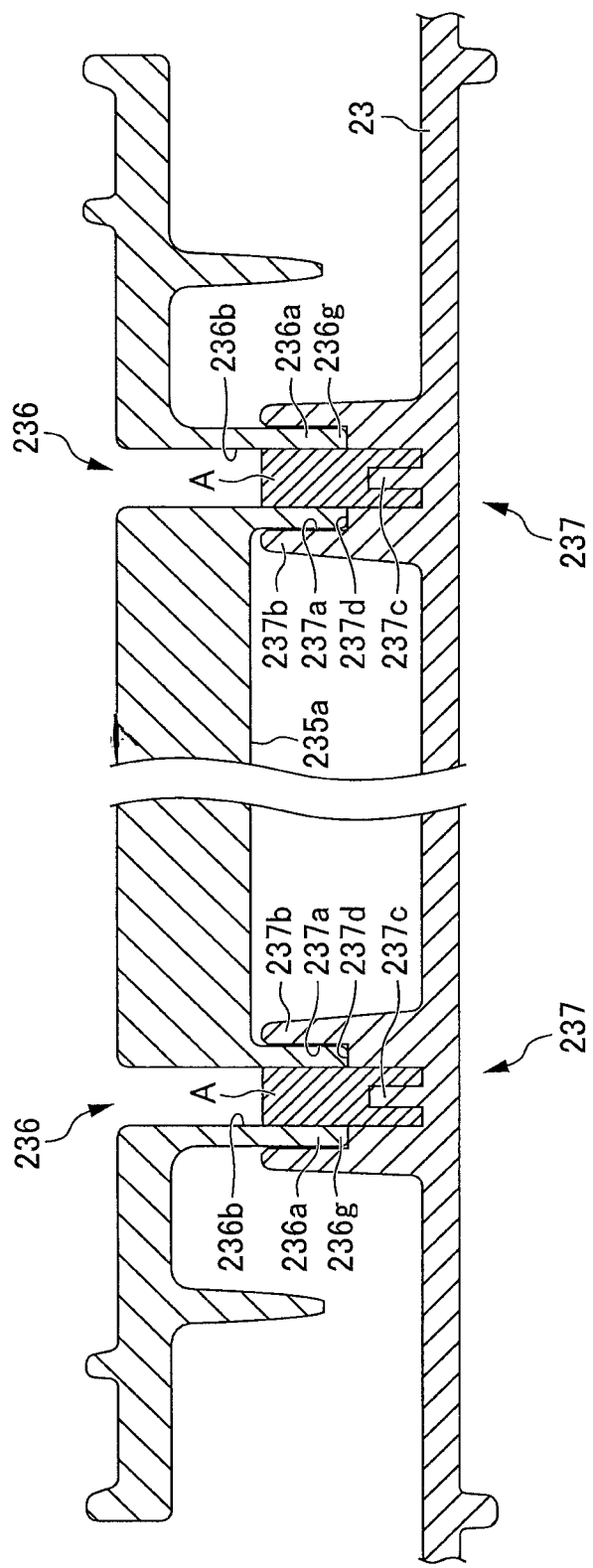
FIG. 5 is a vertical sectional view illustrating a structure for fastening together resin members according to the fourth embodiment of the present invention.

FIG. 2 is a vertical sectional view illustrating a structure for fastening together resin members according to the first embodiment of the present invention. FIG. 3 is a vertical sectional view illustrating a structure for fastening together resin members according to a second embodiment of the present invention. FIG. 4 is a vertical sectional view illustrating a structure for fastening together resin members according to a third embodiment of the present invention. FIG. 5 is a vertical sectional view illustrating a structure for fastening together resin members according to a fourth embodiment of the present invention.

The embodiments shown in FIGS. 2 to 5 illustrate structures for fastening to install the top flange 235 including installation portions 236 which serve as the second resin member to the upper wall 23 including the first resin member of the container main body 2.

First, a structure for fastening together resin members according to the first embodiment of the present invention illustrated in FIG. 2 will be explained in detail.

A plurality of flange installation portions 237 is integrally provided to the upper wall 23 of the container main body 2 as the first resin members.

The flange installation portion 237 includes a recess 237a that is indented from an outer side to inner side of the container main body 2, and a protrusion 237c that protrudes outward at an inner side of the recess 237a.

More specifically, the flange installation portion 237 is configured with a cylindrical portion 237b that protrudes upward from the upper wall 23 of the container main body 2 and is integrally provided, and a protrusion 237c that protrudes upward from the upper wall 23 of the container main body 2 at an inner side of the cylindrical portion 237b and is integrally provided.

Then, the recess 237a is defined with an upper face of the upper wall 23 of the container main body 2 as the bottom face 237d thereof, and with an inner peripheral face of the cylindrical portion 237b as the inner peripheral face thereof.

The protruding height of the protrusion 237c from the upper wall 23 of the container main body 2 is set to be, for example, approximately half or no more than half, compared to the depth of the recess 237a (in other words, the protruding height of the cylindrical portion 237b from the upper wall 23 of the container main body 2).

A plurality of installation portions 236 are integrally provided as part of the top flange 235 and serve as the second resin member.

The installation portion 236 includes an insertion part 236a that can be inserted to the recess 237a from an outside of the flange installation portion 237. The insertion part 236a includes a through-hole 236b that penetrates from a side of the container main body 2 far from the upper wall 23 down to a side near the upper wall 23.

More specifically, the installation portion 236 is configured with the insertion part 236a that protrudes downward from the bottom face 235a at a central portion of the top flange 235 and is integrally provided, and the through-hole 236b that vertically penetrates the insertion part 236a and a portion of the top flange 235 above the insertion part 236a.

The protruding height downward of the insertion part 236a from the bottom face 235a of the top flange 235 is set to be, for example, approximately half, compared to the depth of the recess 237a (in other words, the protruding height of the cylindrical portion 237b from the upper wall 23 of the container main body 2).

Operations of the structure for fastening together resin members in the substrate storing container 1 according to the present embodiment configured as described above will be explained hereinafter.

A molten resin A is poured to the through-hole 236b of the installation portion 236 from above in a state in which the recess 237a of the flange installation portion 237 of the upper wall 23 serving as the first resin member is open upwards, and the insertion part 236a of the installation portion 236 of the top flange 235 serving as the second resin member is inserted into the recess 237a.

At this moment, the amount of the molten resin A thus poured is set to be an amount that fills the depth of the recess 237a. That is to say, it is set to be an amount that fills from the bottom face of the recess 237a up to a predetermined height on an outer peripheral face 237e of the protrusion 237c and the inner peripheral face of the through-hole 236b.

In such a case, by pouring the molten resin A to the through-hole 236b of the installation portion 236 from above, the respective surfaces of the inner peripheral face of the through-hole 236b, the inner peripheral face of the recess 237a continuing downward therefrom, the bottom face of the recess 237a, the outer peripheral face of the protrusion 237c, and the upper face of the protrusion 237c are melted due to the temperature of the molten resin A. For this reason, the surfaces of the abovementioned respective portions which are in contact with the molten resin A enter a state in which the boundary thereof with the molten resin A cannot be distinguished clearly.

In order for the abovementioned such state of the surfaces of the respective portions contacting molten resin A to arise smoothly, the molten resin A used is preferably the same resin as the resin that constitutes the flange installation portion 237 of the upper wall 23 and the resin that constitutes the installation portion 236 of the top flange 235.

However, so long as a resin whereby the abovementioned state of the surfaces of the respective portions contacting the molten resin A arises, resins different from the resin that constitutes the flange installation portion 237 of the upper wall 23 and the resin that constitutes the installation portion 236 of the top flange 235 may be used as the molten resin A.

Subsequently, when the temperature of the molten resin A decreases and the molten resin A hardens, the boundary region in the state in which the boundaries of the surfaces of the abovementioned respective portions cannot be clearly distinguished from the molten resin A hardens in this state. For this reason, the boundary region between the resin A and the surfaces of the abovementioned respective portions is fixed integrally in practice with a sense of unity as if there were no boundary therebetween from the beginning.

Furthermore, when the temperature of the molten resin A decreases and the molten resin A hardens, the volume of the resin A slightly shrinks. Due to this shrinkage, the resin A compresses inwardly the outer peripheral face of the protrusion 237c.

For this reason, the resin A hardens so as to compress the protrusion 237c specifically at the boundary region between the resin A and the outer peripheral face of the protrusion 237c and, therefore, is integrally fixed more strongly than other boundary regions.

In accordance with the present embodiment, the following effects are exerted.

(1) The flange installation portion 237 of the upper wall 23 serving as the first resin member is fastened to the installation portion 236, which is part of the top flange 235 and serves as the second resin member by way of the molten resin A. At this moment, the surfaces of the respective portions of the flange installation portion 237 of the upper wall 23 and the installation portion 236 of the top flange 235, which are contacted by the molten resin A, constitute the boundary region in a state in which the boundary thereof with the molten resin A is not clear due to melting from the influence of the temperature of the molten resin A. Then, the boundary region hardens in this state. For this reason, even in a case of being subjected to vibration or impact at the fastening portion, there is no risk of the occurrence of loosening of a screw in a case of threaded fastening, or dislocation in a case of press fitting, and thus it is possible to maintain a stable fastened state.

(2) The molten resin A that fastens the flange installation portion 237 of the upper wall 23 and the installation portion 236 of the top flange 235 slightly shrinks when hardening from the temperature of the molten resin A decreasing. Due to this shrinkage, since the resin A hardens so as to compress the protrusion 237c at the boundary region between the resin A and the outer peripheral face of the protrusion 237c of the flange installation portion 237, it is fixed more strongly compared to other boundary regions. Therefore, compared to a case of not providing the protrusion 237c, it is possible to maintain a more stable fastened state.

(3) It is unnecessary to position the top flange 235 with respect to the container main body 2 with a predetermined precision and to fasten a screw at a fixed torque in an assembly process as in the case of fastening by way of threaded fastening. For this reason, it is possible to shorten the time for assembling operations, and variations due to assembly error also do not occur easily.

(4) Unlike the case of fastening by way of threaded fastening, since a screw is not used, the component number can be reduced.

(5) Since the molten resin A flows into gaps between the inner peripheral face of the recess 237a and the outer peripheral face of the insertion part 236a, there is no longer a gap between the recess 237a and the insertion part 236a. For this reason, water drainage improves upon washing the container main body 2.

Next, a structure for fastening together resin members according to a second embodiment of the present invention illustrated in FIG. 3 will be explained.

Since the structure for fastening together resin members according to the present embodiment is almost the same as the structure for fastening together resin members according to the first embodiment, only portions different from the structure for fastening together resin members according to the first embodiment will be explained, and the explanations thereof will be abbreviated by appending the same reference symbols used in the first embodiment to similar portions.

An insertion part 236a of an installation portion 236, which is a part of a top flange 235 and serves as a second resin member includes an overhang portion 236c that overhangs to an inner side of the through-hole 236b from an inner peripheral face of a through-hole 236b at a tip end portion in an inserting direction. Then, a molten resin A is filled up to the inner peripheral face of the through-hole 236b above the overhang portion 236c.

More specifically, a tapered portion 236d at which an inner diameter of the through-hole 236b narrows toward above from the tip end portion in the inserting direction is integrally provided at the insertion part 236a.

The overhang portion 236c and the tapered portion 236d share a common feature of an upper face thereof overhanging toward the inner side of the through-hole 236b. Therefore, so long as including an upper face overhanging toward the inner side of the through-hole 236b, the overhang portion 236c may not necessarily have a tapered shape.

Operations of the structure for fastening together resin members in the substrate storing container 1 according to the present embodiment configured as described above will be explained.

When the molten resin A is poured into the through-hole 236b of the installation portion 236 of the top flange 235, the surfaces of the respective portions of the flange installation portion 237 and the installation portion 236 contacted by the molten resin A are melted due to the influence of the temperature of the molten resin A, thereby constituting the boundary region in a state in which the boundary thereof with the molten resin A cannot be distinguished. The top face of the overhang portion 236c (the tapered portion 236d) with which the molten resin A is in contact also constitutes a boundary region of a similar state.

Subsequently, when the temperature of the molten resin A decreases and the molten resin A hardens, the boundary region in the state in which the boundary between the resin A and the surfaces of the abovementioned respective portions is not clear hardens in this state.

For example, a case may also be considered in which the surfaces of the respective portions of the flange installation portion 237 and the installation portion 236, which are contacted by the molten resin A, are not melted sufficiently with the influence of the temperature of the molten resin A, such as a case in which the resin constituting the flange installation portion 237 or the resin constituting the installation portion 236 has a melting point higher than that of the molten resin A.

In such a case, if there is not the overhang portion 236c (the tapered portion 236d), in the case of an upwards force acting on the top flange 235 by the hardened resin A located at the inner side of the through-hole 236b, the hardened resin A that is located at the inner side of the through-hole 236b may fall out in a downward direction from the through-hole 236b.

However, with the structure for fastening together resin members in the substrate storing container 1 according to the present embodiment, since the upper face of the overhang portion 236c (the tapered portion 236d) overhangs at the inner side of the through-hole 236b, the abovementioned such falling out does not occur. This is because, since the diameter of the hardened resin A located above the overhang portion 236c (the tapered portion 236d) is greater than the diameter of an opening formed by the upper face of the overhang portion 236c (the tapered portion 236d), it is not possible to pass the overhang portion 236c (the tapered portion 236d).

In accordance with the present embodiment, the following effects are exerted in addition to the abovementioned effects of (1) to (5).

(6) The diameter of the hardened resin A located above the overhang portion 236c is greater than the diameter of the opening formed by the upper surface of the overhang portion 236c. Therefore, it is not possible for the hardened resin A located above the overhang portion 236c to pass the overhang portion 236c. Therefore, the falling out of the hardened resin A located on the inner side of the through-hole 236b in a downward direction from the through-hole 236b is reliably prevented.

In the present embodiment, in order to prevent the hardened resin A located at the inner side of the through-hole 236b from falling out in a downward direction from the through-hole 236b, the insertion part 236a of the installation portion 236 of the top flange 235 includes the overhang portion 236c overhanging to an inner side of the through-hole 236b from the inner peripheral face of the through-hole 236b at the tip end portion in the inserting direction.

However, as the structure for fastening together resin member according to the first embodiment of the present invention illustrated in FIG. 2, even in a case of not including the overhang portion, for example, it is possible to acquire similar effects by making a hole in the horizontal direction (not illustrated) in the insertion part 236a of the installation portion 236 of the top flange 235. This is because the resin A which flows in the hole in the horizontal direction and hardens cannot fall out from the hole.

Next, a structure for fastening together resin members according to the third embodiment of the present invention illustrated in FIG. 4 will be explained.

Since the structure for fastening together resin members according to the present embodiment is almost the same as the structure for fastening together resin members according to the first embodiment, only portions different from the structure for fastening together resin members according to the first embodiment will be explained, and the explanations thereof will be abbreviated by appending the same reference symbols used in the first embodiment to similar portions.

An insertion part 236a of an installation portion 236, which is part of a top flange 235 and serves as a second resin member includes a step portion 236e serving as an overhang portion that overhangs to an inner side of the through-hole 236b from an inner peripheral face of the through-hole 236b, at the middle of an inserting direction. Then, the molten resin A is filled up to the inner peripheral face of the through-hole 236b above the step portion 236e.

More specifically, the insertion part 236a includes the step portion 236e at the middle of the inserting direction, and also includes a small diameter portion 236f at a side below the step portion 236e, having a smaller diameter compared to at a side above the step portion 236e. The outer diameter and the inner diameter of the small diameter portion 236f are respectively smaller compared to the outer diameter and the inner diameter at the side above the step portion 236e.

Operations of the structure for fastening together resin members in the substrate storing container 1 according to the present embodiment configured as described above will be explained.

When the molten resin A is poured into the through-hole 236b of the installation portion 236 of the top flange 235, the surfaces of the respective portions of the flange installation portion 237 and the installation portion 236 with which the molten resin A is in contact melt due to the influence of the temperature of the molten resin A, a result constitute the boundary region in a state in which the boundary with the molten resin A is not clear. The top face of the step portion 236e with which the molten resin A is in contact constitutes a boundary region in the same state.

Subsequently, when the temperature of the molten resin A decreases and the molten resin A hardens, the boundary region in the state in which the boundaries between the resin A and the surfaces of the abovementioned respective portions is not clear hardens in this state.

For example, a case may also be considered in which the surfaces of the respective portions of the flange installation portion 237 and the installation portion 236, which are contacted by the molten resin A, are not melted sufficiently with the influence of the temperature of the molten resin A, such as a case in which the resin constituting the flange installation portion 237 or the resin constituting the installation portion 236 has a melting point higher than that of the molten resin A.

In such a case, if there is not the step portion 236e, in the case of an upwards force acting on the top flange 235 by the hardened resin A positioned on the inner side of the through-hole 236b, the hardened resin A that is located at the inner side of the through-hole 236b may fall out in a downward direction from the through-hole 236b.

However, with the structure for fastening together resin members in the substrate storing container 1 according to the present embodiment, since the upper face of the step portion 236e overhangs to the inner side of the through-hole 236b, the abovementioned falling out does not occur. This is because, since the diameter of the hardened resin A located above the step portion 236e is greater than the small diameter portion 236f located below the step portion 236e, it is not possible to pass the step portion 236e and the small diameter portion 236f.

In addition, in the structure for fastening together resin members in the substrate storing container 1 according to the present embodiment, the outer peripheral face of the small diameter portion 236f operates similarly to the protrusion 237c.

In other words, when the temperature of the molten resin A decreases and the molten resin A hardens, the volume of the resin A slightly shrinks. Due to this shrinkage, the resin A inwardly compresses the outer peripheral face of the small diameter portion 236f.

For this reason, the resin A hardens so as to compress the small diameter portion 236f specifically at the boundary region between the resin A and the outer peripheral face of the small diameter portion 236f, and thus is integrally fixed more strongly compared to other boundary regions.

Moreover, since the diameter of the outer peripheral face of the small diameter portion 236f is greater than the diameter of the outer peripheral face of the protrusion 237c, the area thereof is greater. For this reason, the operation of the resin A which shrinks while hardening inwardly compressing the outer peripheral face of the small diameter portion 236f is greater than the operation of inwardly compressing the outer peripheral face of the protrusion 237c.

In accordance with the present embodiment, the following effects are exerted in addition to the abovementioned effects of (1) to (6).

(7) The molten resin A fastening the flange installation portion 237 of the upper wall 23 and the installation portion 236 of the top flange 235 slightly shrinks when the temperature thereof decreases and hardens. Due to this shrinkage, at the boundary region between the outer peripheral face of the small diameter portion 236f of the installation portion 236 and the resin A, since the resin A hardens so as to compress the small diameter portion 236f, the boundary region is fixed more strongly compared to other boundary regions. Therefore, compared to a case of not having the small diameter portion 236f, it is possible to maintain a more stable fastened state.

Next, a structure for fastening together resin members according to a fourth embodiment of the present invention illustrated in FIG. 5 will be explained.

Since the structure for fastening together resin members according to the present embodiment is almost the same as the structure for fastening together resin members according to the first embodiment, only portions different from the structure for fastening together resin members according to the first embodiment will be explained, and the explanations thereof will be abbreviated by appending the same reference symbols used in the first embodiment to similar portions.

A recess 237a of a flange installation portion 237 of an upper wall 23 serving as the first resin member includes an abutting portion 237d that a tip end portion 236g in an inserting direction of an insertion part 236a abuts when the insertion part 236a of the installation portion 236, which is part of the top flange 235 and serves as the second resin member is inserted.

More specifically, at a bottom face of the recess 237a, the abutting portion 237d which limits the inserted length of the insertion part 236a to a predetermined insertion amount is integrally provided in a region corresponding to the insertion part 236a to be inserted.

When the insertion part 236a is inserted into the recess 237a, the tip end portion 236g of the insertion part 236a and the abutting portion 237d of the recess 237a cooperate with each other to constitute a positioning portion that positions an interval between the flange installation portion 237 and the top flange 235 (the height of the top flange 235 with respect to the flange installation portion 237).

Operations of the structure for fastening together resin members in the substrate storing container 1 according to the present embodiment configured as described above will be explained.

When the insertion part 236a is inserted into the recess 237a, the insertion length of the insertion part 236a is limited to a predetermined insertion amount by the tip end portion 236g in the inserting direction of the insertion part 236a abutting with the abutting portion 237d. In other words, the height of the insertion part 236a with respect to the recess 237a is maintained at a predetermined height. For this reason, by the insertion part 236a simply being positioned on the abutting portion 237d, the height of the top flange 235 with respect to the flange installation portion 237 is positioned at a predetermined height.

In accordance with the present embodiment, the following effects are exerted in addition to the abovementioned effects of (1) to (5).

(8) By the insertion part 236a simply being positioned on the abutting portion 237d, it is possible to position the height of the top flange 235 with respect to the flange installation portion 237 at a predetermined height. Therefore, it is possible to suppress variation in the height of the top flange 235 from the upper wall 23 of the container main body 2.

In the present embodiment, in order to position the height of the top flange 235 with respect to the flange installation portion 237 of the upper wall 23 at a predetermined height, the recess 237a of the flange installation portion 237 includes the abutting portion 237d which the tip end portion 236g of the insertion part 236a abuts when the insertion part 236a of the installation portion 236 of the top flange 235 is inserted.

However, the method of positioning the height of the top flange 235 with respect to the flange installation portion 237 of the upper wall 23 at a predetermined height is not limited to this.

For example, an appropriate step or projection is provided in the middle of the insertion part 236a of the installation portion 236, while an appropriate step-abutting portion or projection-abutting portion is provided at the recess 237a of the flange installation portion 237. This step or projection and step-abutting portion or projection-abutting portion constitute a positioning portion. Then, when the insertion part 236a is inserted, it is possible to position the height of the top flange 235 with respect to the flange installation portion 237 of the upper wall 23 at a predetermined height, by the step or projection abutting the step-abutting portion or the projection-abutting portion of the recess 237a.

Furthermore, for example, when the insertion part 236a is inserted, it is possible to position the height of the top flange 235 with respect to the flange installation portion 237 of the upper wall 23 at a predetermined height by an upper end part of the cylindrical portion 237b of the flange installation portion 237 abutting a part corresponding to the cylindrical portion 237b at the bottom face 235a of a center portion of the top flange 235.

In such a case, it is also possible to set a predetermined height for positioning by providing a downwardly directed convex portion or recess as necessary to a part corresponding to the cylindrical portion 237b at the bottom face 235a of the center portion of the top flange 235.

It should be noted that the present invention is not limited to the aforementioned respective embodiments, and various modifications thereto are possible within the technical scope described in the claims.

For example, various shapes of horizontal sectional views are possible as illustrated in FIG. 6(a) to FIG. 6(f) for the shape of the protrusion 237c.

Figure 6:
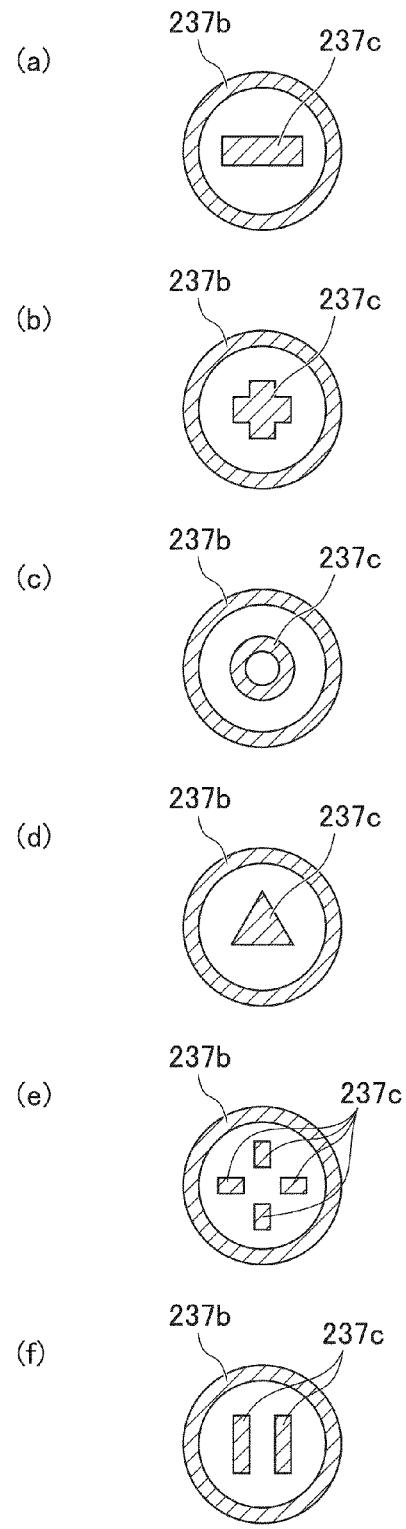
FIG. 6 provides horizontal sectional views illustrating various examples of shapes of protrusions used for a structure for fastening together resin members according to the present invention.
Figure 7:
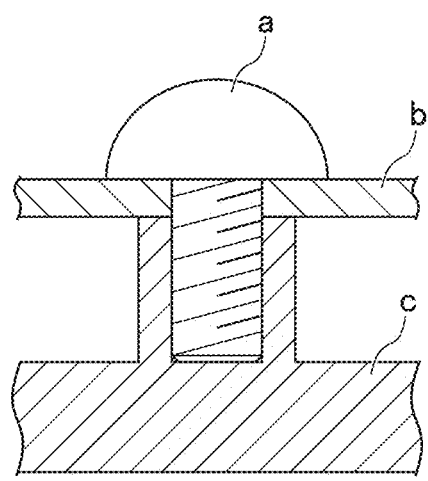
FIG. 7 is a vertical sectional view illustrating an example of a structure for fastening together conventional resin members.

FIG. 6(a) illustrates a protrusion 237c having a rectangular horizontal sectional shape.

FIG. 6(b) illustrates the protrusion 237c having a cross shaped horizontal sectional shape.

FIG. 6(c) illustrates a protrusion 237c having a cylindrical horizontal sectional shape.

FIG. 6(d) illustrates a protrusion 237c having a triangular horizontal sectional shape.

FIG. 6(e) illustrates four protrusions 237c that are each arranged with an interval of 90° along a circumferential direction.

FIG. 6(f) illustrates two protrusions 237c that are arranged in parallel to each other.

Furthermore, in the abovementioned respective embodiments, the structure for fastening the top flange 235 to the upper wall 23 of the container main body 2 is explained.

However, it can go without saying that the present invention can be implemented by applying each of the abovementioned embodiments even to a structure for fastening an arbitrary resin member other than the top flange 235 to an arbitrary wall 20 of the container main body 2.

The second resin member includes various members constituting the substrate storing container 1, such as a container handle (not illustrated), and a bottom plate (not illustrated), in addition to the top flange 235.

For example, it is possible to apply the abovementioned respective embodiments to a structure for fastening a pair of container handles (not illustrated) serving as the second resin member to a first side wall 25 and a second side wall 26 serving as the first resin member of the container main body 2.

Furthermore, for example, it is possible to apply the abovementioned respective embodiments to a structure for fastening a bottom plate (not illustrated) as the second resin member to a lower wall 24 as the first resin member of the container main body 2.

Moreover, it can go without saying that the present invention can be implemented by applying the abovementioned respective embodiments even to a structure for fastening an arbitrary resin member to not necessarily the container main body 2, but also to a lid body 3.

Furthermore, the shapes of the container main body 2 and the lid body 3, the number or dimensions of the substrates that can be stored in the container main body 2 are not limited to the shapes, number and dimensions for the container main body 2 and lid body 3 in the present embodiments.

EXPLANATION OF REFERENCE NUMERALS

1 substrate storing container
2 container main body
23 upper wall
235 top flange
236 installation portion (second resin member)
236*a* insertion part
236*b* through-hole
236*c* overhang portion
236*d* tapered portion
236*e* step portion (overhang portion)
236*f* small diameter portion
236*g* tip end portion (positioning portion)
237 flange installation portion (first resin member)
237*a* recess
237*b* cylindrical portion
237*c* protrusion
237*d* abutting portion (positioning portion)
3 lid body
A molten resin

The invention claimed is:

1. A fastening structure comprising a first resin member and a second resin member in a substrate storing container, the substrate storing container including a container main body, a lid body and a flange, the container main body having a substrate storing space for storing a plurality of substrates, and having an opening circumferential portion which is in communication with the substrate storing space at one end portion of the container main body; the lid body being removably attached to the opening circumferential portion for closing the container main body;

the container main body having walls, including an upper wall;
the first resin member being part of the upper wall;
the second resin body being part of the flange;
the fastening structure comprising:
a cylindrical portion in the first resin member having a recess that is concave outwardly, and a protrusion in the recess that protrudes outwardly;
an insertion part in the second resin member for inserting into the recess, the insertion part including a through-hole extending through the second resin member, so that the recess is in communication with a space outside the second resin member; and
molten resin, received into the recess via the through-hole, for filling the recess from a bottom face of the recess up to an outer peripheral face of the protrusion and the insertion part, and for fastening the cylindrical portion and the protrusion of the first resin member to the insertion part of the second resin member.

2. The fastening structure according to claim 1, wherein the insertion part of the second resin member includes an overhang portion that overhangs into the through-hole, and the molten resin is filled up to the insertion part beyond the overhang portion.

3. The fastening structure according to claim 1, wherein the first resin member and the second resin member respectively include positioning portions that cooperate with each other to position an interval between the first resin member and the second resin member.

* * * * *